(12) United States Patent
Hanks

(10) Patent No.: US 6,953,889 B2
(45) Date of Patent: Oct. 11, 2005

(54) ELECTRICAL SHIELD

(75) Inventor: D'Anne Beukelaer Hanks, Santa Rosa, CA (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/700,703

(22) Filed: Nov. 4, 2003

(65) Prior Publication Data

US 2004/0094317 A1 May 20, 2004

Related U.S. Application Data

(62) Division of application No. 10/008,850, filed on Nov. 7, 2001, now abandoned.

(51) Int. Cl.⁷ .................................................. H05K 9/00
(52) U.S. Cl. ...................... 174/35 R; 174/32; 174/35 C; 174/35 SM
(58) Field of Search ................................ 174/97, 72 A, 174/33, 35 R, 72 C, 72 R

(56) References Cited

U.S. PATENT DOCUMENTS 4,764,422 A    8/1988  Hill et al.

*Primary Examiner*—Dean A. Reichard
*Assistant Examiner*—Jinhee Lee
(74) *Attorney, Agent, or Firm*—Richard A. Mysliwiec; Bobby D. Slaton; V. Lawrence Sewell

(57) ABSTRACT

An electrical shield for mounting on a backplane of a telecommunications equipment rack that provides attenuation to electromagnetic interference (EMI) and protection from electrostatic discharge (ESD). The electrical shield has a body of moldable structural foam material that has channels formed on one side to accommodate electrical cables on the backplane. An electrically conductive coating is deposited on a substantially planar surface of the other side of the body of moldable material to provide an electrically conductive relationship with the telecommunications equipment rack.

8 Claims, 5 Drawing Sheets

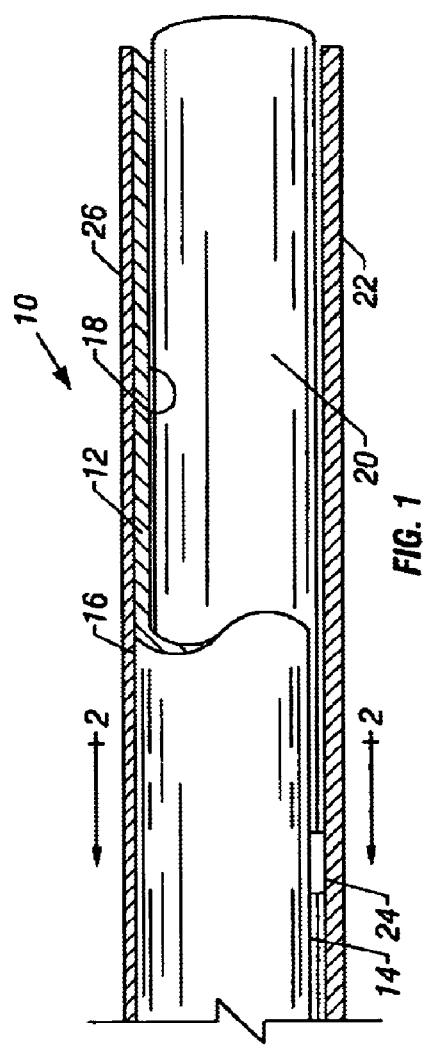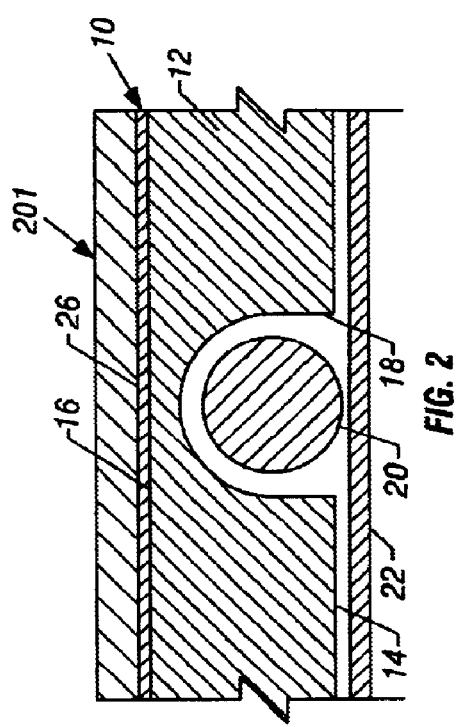

ELECTRICAL SHIELD

This application is a divisional of U.S. patent application Ser. No. 10/008,850 filed Nov. 7, 2001 now abandoned.

BACKGROUND OF THE INVENTION

1. Technical Field of the Invention

This invention relates generally to providing electromagnetic interference (EMI) shielding in electrical equipment. More particularly, this invention relates to an electrical shield assembly operable to provide electromagnetic compliance (EMC) using a structural mold in telecommunications equipment racks.

2. Description of Related Art

The demand for telecommunications services has increased substantially due to the proliferation of local telephone lines, mobile subscribers, pagers, fax machines and the Internet. The high demand for telecommunications services translates into densely populated telecommunications equipment that must meet rigorous technical specifications and form factors. For example, Bellcore (now Telcordia) Specification GR-1089-CORE provides a set of generic criteria for EMC and electrical safety in network equipment. GR-78-CORE and GR-63-CORE provide, respectively, general physical design requirements and Network Equipment Building Systems (NEBS) physical protection criteria for the equipment.

Typically, the electrical requirements for the network equipment include compliance with various electrostatic discharge (ESD) tests as well as EMI susceptibility tests. Electrostatic charge may build up on any conductive surface of a telecommunications equipment rack such as, for example, a backplane disposed in a high speed fiber bank (HSFB), which can cause damage to electronic components therein. Therefore, the risk of ESD must be reduced or eliminated by establishing an effective discharge path to a ground source such as the equipment chassis.

Additionally, the electrical cabling disposed in a telecommunications equipment rack may emanate unwanted "electrical noise" that can cause EMI, which may affect electrical sub-systems that are not even connected to the cabling. As is well known, unmitigated EMI may lead to noise currents and intermittent data problems.

Several solutions addressing the ESD and/or EMI issues in telecommunications network equipment have been available for some time. Whereas such solutions are generally effective in satisfying the applicable standards, they are beset with numerous deficiencies and shortcomings, however. In general, the existing solutions can be divided into two types: EMI shields and EMI absorbing materials. EMI shields either reflect electromagnetic waves propagating towards the electronic equipment and prevent the waves from propagating into the shielded part of the electronic equipment or, alternatively, reflect electromagnetic waves generated from the inside of the electronic equipment inwardly such that they will not radiate out of the electronic equipment. Where the existing EMI shields are not of metallic composition, conductive platings or paints that limit EMI and ESD are typically used for encasing the electronic equipment, which is thereby provided with protection against disturbing electromagnetic waves. Typically, the EMI shields are deposited on the electronic equipment by either metal-arc spraying, vacuum metallizing, evaporating, cladding or electroplating.

In practice, however, it is not always easy to form EMI shields over the plastic surfaces of electronic equipment such as electrical cabling. Often, the plastic surfaces of electrical cabling have to be given a mechanical pretreatment in order to ensure positive depositing of the intended EMI shields. Moreover, mechanical pretreatments such as surface roughening may damage the electrical cabling.

The second type of existing solutions involve electric wave absorbing materials which convert incident electric waves to thermal energy so that the intensity of their transmission or reflection is reduced markedly. In typical implementations, the EMI absorption materials include ferrite cores which are rods comprised of metal and carbon blends. Ferrite cores are very effective in attenuating EMI when implemented in large numbers. Generally, eight or more ferrite cores, or ferrite cores having a rather larger size are required per electrical cable to effectively attenuate EMI. Although ferrite cores are effective in attenuating EMI when used in large numbers, they are heavy, bulky, expensive and brittle.

Other materials that are effective as absorbers of electric waves include compositions of aluminum, lead, zinc, titanium, lithium, steel, silver and copper. In particular, PZT (lead zirconate titanate) and PLZT (lead lanthanum zirconate titanate) are effective in absorbing electric waves at frequencies in the GHz band. However, the amount by which these compositions can be dispersed or incorporated into plastics is limited by various factors including the melt viscosity of the plastics used, their processability, mechanical strength, brittleness and adhesion of the fibers, films, sheets and other shaped parts of the plastics in which those metals are dispersed or incorporated. It is also known that if the incorporation of conductive metals is unduly small, satisfactory absorption characteristics are not attained.

Therefore, a need has arisen for a cost effective EMC solution that is capable of providing ESD prevention and EMI shielding to today's telecommunications equipment with relative ease, while still meeting the rigorous form factor requirements and technical specifications.

SUMMARY OF THE INVENTION

In one aspect, the present invention is directed to an electrical shield comprising a body of moldable material which has a number of channels formed on one side for guiding and strain relieving cables. The moldable material is preferably comprised of a structural plastic foam. On another side of the moldable body having a substantially planar surface, an electrically conductive coating is deposited. The electrically conductive coating may be a metallic coating such as a non-oxidizing copper layer. Preferably, the electrically conductive coating may be sprayed on the substantially planar surface and is operable to form a conductive relationship with the chassis of an equipment rack. In a further preferred embodiment, the electrically conductive coating is deposited on the entire body of moldable material. One or more connector holes intersect one of the channels and the substantially planar surface. In a presently preferred exemplary embodiment, a slot having an ergonomically contoured hold intersects each channel and the substantially planar surface. The channel and slot are positioned to accommodate an electrical cable. A contour intersects a channel and is positioned to house at least one ferrite core.

In another aspect, the present invention is directed to a telecommunications equipment rack having EMC capability. A bank with a backplane having groomed electrical cables is disposed in the equipment rack. A molding formed from a structural plastic foam body having a plurality of channels on one of its surfaces is coupled to the backplane to accommodate the electrical cables. Several fasteners couple the molding to the backplane. An electrically conductive material is deposited on another surface of the molding for providing an electrically conductive relationship with the chassis. In a further exemplary embodiment, a conductive plate is coupled to the molding over the electrically conductive material for enhanced conductivity.

In a further aspect, the present invention is directed to a method for providing electromagnetic interference shielding in an equipment bank having a backplane. Cables coupled to the backplane are groomed into a predetermined pattern. A molding of a structural plastic foam body having a plurality of channels is attached to the backplane. The channels substantially conform to the pattern of cables and thereby accommodate the plurality of cables therein. A coating is deposited on at least one side of the molding to provide an electrically conductive relationship with a chassis portion of the telecommunications equipment rack.

BRIEF DESCRIPTION OF THE DRAWINGS

The accompanying drawings are incorporated into and form a part of the specification to illustrate the preferred embodiments of the present invention. Various advantages and features of the invention will be understood from the following Detailed Description taken in connection with the appended claims and with reference to the attached drawing figures in which:

FIG. 1 is a longitudinal sectional view showing an electrical cable within a channel of an exemplary electrical shield of the present invention;

FIG. 2 is a cross-sectional view taken along the line 2–2' of FIG. 1 showing the electrical cable within the channel of the electrical shield of the present invention;

DETAILED DESCRIPTION OF THE DRAWINGS

Figure 3:
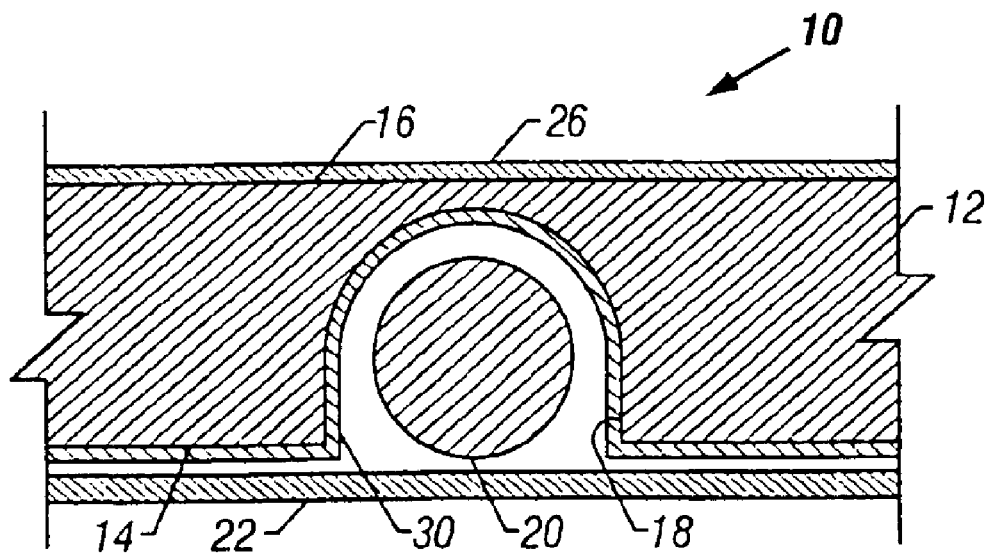
FIG. 3 is a cross-sectional view of a presently preferred alternative embodiment of the present invention showing a conductive coating deposited on a channel and an inner surface of the electrical shield.

Preferred embodiments of the invention will now be described with reference to various examples of how the invention can best be made and used. Like reference numerals are used throughout the description and several views of the drawings to indicate like or corresponding parts, wherein the various elements are not necessarily drawn to scale.

Referring now to the drawings, and more particularly to FIG. 1 and FIG. 2 together, there is shown an electrical shield, generally designated reference numeral 10, which incorporates an exemplary preferred embodiment of the present invention. The electrical shield 10 includes a body of moldable material 12 having an inner surface 14 (i.e., a first or primary side) and an outer surface 16 (i.e., a second or secondary side). The body of moldable material 12 is comprised of structural plastic foam. Preferably, the structural plastic foam is manufactured from a low pressure injection mold process which utilizes a variety of plastic resins such as Noryl FN215X. It is further preferred that the structural plastic foam have flame retardant capabilities. Noryl FN215X has high production reliability and a V-0 (UL 94) rating. It should be noted by one skilled in the art that any plastic resin that has a suitable production reliability and meets telecommunications industry technical specifications, such as GR-63-CORE, is acceptable.

During the molding process which forms the body of moldable material 12, inert gas is introduced into the plastic resin. This results in the formation of bubbles that create a cellular structure inside a tough outer skin. This imparts to the body of moldable material a thicker cross section and less weight than a solid molded part. Also, the low pressure used during the injection molding process reduces stress and sink marks in the finished product and lowers tooling costs.

A channel 18 is formed on the inner surface 14 and an electrical cable 20 is received therethrough. The electrical cable 20 is free to mechanically "float" within the moldable material 12 while snugly encapsulated therein, and thus is decoupled from external mechanical forces and stresses. The electrical cable 20 is connected to a backplane 22 at a terminus (not shown). A fastener or any other affixing mechanism 24 couples the inner surface 14 of the electrical shield 10 to the backplane 22.

An electrically conductive coating 26 is deposited on the outer surface 16 of the electrical shield 10. The electrically conductive coating 26 provides attenuation from EMI and eliminates ESD by providing an electrically conductive relationship to the chassis 201 of a telecommunications equipment rack (not shown). Preferably, the electrically conductive coating is a layer of suitable metallic coating. In the presently preferred exemplary embodiment of the present invention, the electrically conductive coating 26 uses a non-oxidizing copper, such as Spraylat 599-Y1371, as the conductive agent. Spraylat 599-Y1371 is applied using a sprayable metallic coating system that has a film thickness of about 2 mil and a hardness of about 4H. Spraylat 599-Y1371 provides more than 75 dB attenuation from 1 MHz to 1 GHz with a surface resistivity of less than 0.050+/−0.005 Ohms/sq. inch. It should be noted by one skilled in the art that any conductive coating that provides a suitable attenuation to EMI and meets telecommunications industry technical specifications is acceptable.

FIG. 3 depicts a presently preferred exemplary embodiment of the present invention. An electrical conductive coating 30 is deposited on the inner surface 14 and the channel 18 of the electrical shield 10. The electrical conductive coatings 26 and 30 completely encase moldable material 12 to provide enhanced grounding, thereby effectively attenuating EMI.

Figure 4:
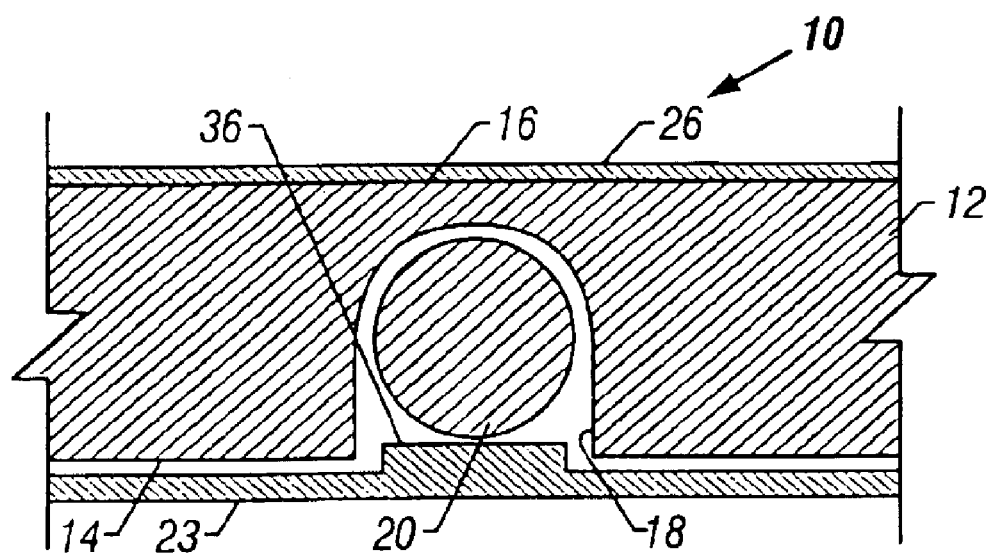
FIG. 4 is a cross-sectional view of an alternative embodiment of the present invention showing a mechanical cover coupled to the electrical shield.

Referring now to FIG. 4, in an alternative embodiment of the present invention, a mechanical cover 23 having a raised portion 36 is first coupled to the moldable body 12. The raised portion 36 is dimensioned to match the cable-bearing channel 18 and thus improves mechanical retention and grounding properties of the electrical shield 10.

Figure 5:
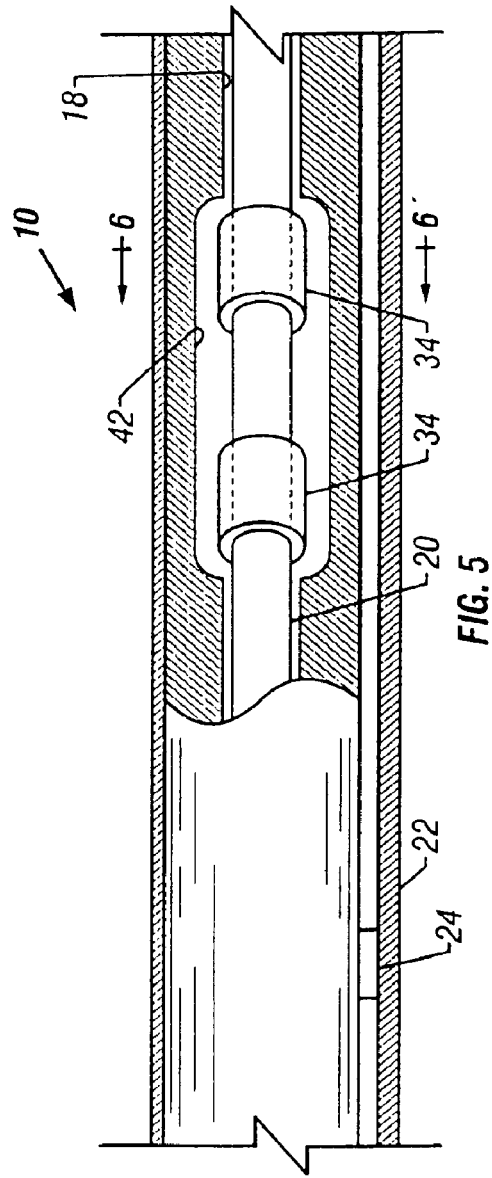
FIG. 5 is a longitudinal sectional view showing ferrite cores disposed relative to the terminus of an electrical cable within a contour formed in the electrical shield of the present invention.
Figure 6:
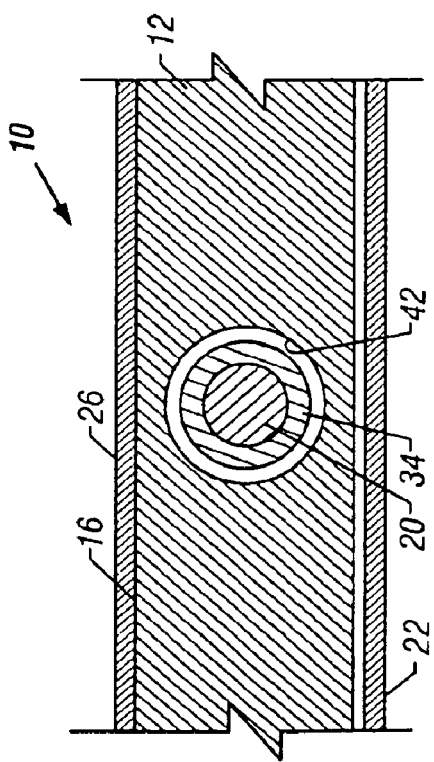
FIG. 6 is a cross-sectional view taken along the line 6–6' of FIG. 5.

The electrical shield 10 of the present invention is operable to accommodate a minimum number of ferrite cores over the electrical cables disposed in its channels. FIG. 5 depicts a longitudinal sectional view showing ferrite cores 34 disposed over the electrical cable 20. FIG. 6 depicts a cross-sectional view taken along the line 6–6' of FIG. 5 wherein the ferrite cores 34 surrounding or encircling the cable 20 are exemplified. The ferrite cores 34 are coupled to the electrical cable in any known or heretofore unknown manner including "snap-on" methods or by an adhesive epoxy. As before, channels formed in the moldable body material are operable to accommodate the electrical cable 20. As shown in FIG. 5, a contour 42 is formed in the inner surface of the moldable body which intersects the channel 18 for housing the ferrite cores 34. The ferrite cores 34 disposed in the contour 42 are decoupled from external mechanical forces and stresses, and thereby "float" in the cavity of the contour 42.

As mentioned, ferrite cores are blends of various metals and carbon. Sinters, bonded masses of metal particles shaped and partially fused by pressure and heating, are effective at attenuating frequencies typically between 30 MHz and 300 MHz. Carbon composition is effective at comparatively much higher frequencies in the gigahertz band. The absorption characteristics of a ferrite core can be controlled by adjusting the content of the sinters and carbon in the ferrite core. The absorption characteristics can be further modified by adding an organic dispersion agent such as rubber or plastic.

As discussed, ferrite cores are expensive and due to their brittleness require frequent replacement. Existing solutions require at least four ferrite cores at each terminus of an electrical cable. The electrical shield of the present invention provides improved EMI and ESD protection with one or two ferrite cores at each terminus. Furthermore, depending on the strength of the offensive electrical signals, the electrical shield of the present invention may provide sufficient EMI and ESD protection with no ferrite cores. The elimination or reduction of the number of ferrite cores required to provide EMI and ESD protection greatly reduces the overall cost of the equipment.

Figure 7:
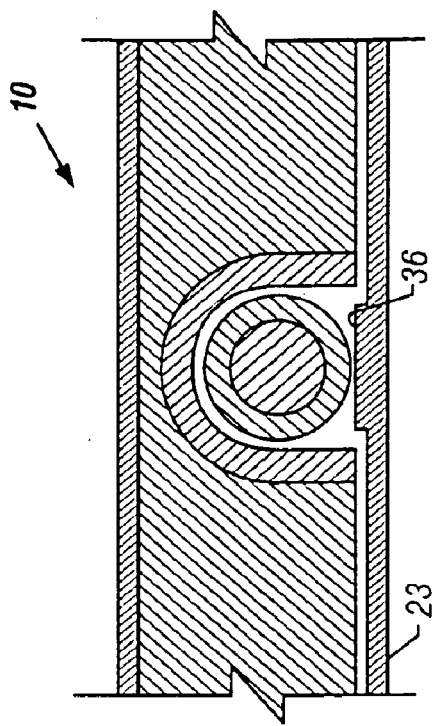
FIG. 7 is a cross-sectional view of an alternative embodiment of the present invention showing a mechanical cover coupled to the electrical shield.

FIG. 7 depicts an alternative embodiment of the present invention, where a mechanical cover 23 having a raised portion 36 is provided similar to the exemplary embodiment depicted in FIG. 4. As explained before, the mechanical cover 23 is operable to provide better stress relief and grounding properties.

It should be appreciated that where a reduced number of ferrite cores are used, they may be tubular and be placed around the cable termini, as exemplified hereinabove. In other embodiments, they may also be placed differently with respect to the cable. It should be apparent to one skilled in the art that the design of electrical shield 10 is flexible enough to accommodate other ferrite core arrangements. Additionally, it should be noted by one skilled in the art that the electrical shield 10 can accommodate various other embodiments and combinations of embodiments. For example, the electrical shield of the present invention can be designed to accommodate the complete conductive coating of FIG. 3. Moreover, laterally-placed ferrite core arrangements are also possible.

Figure 8:
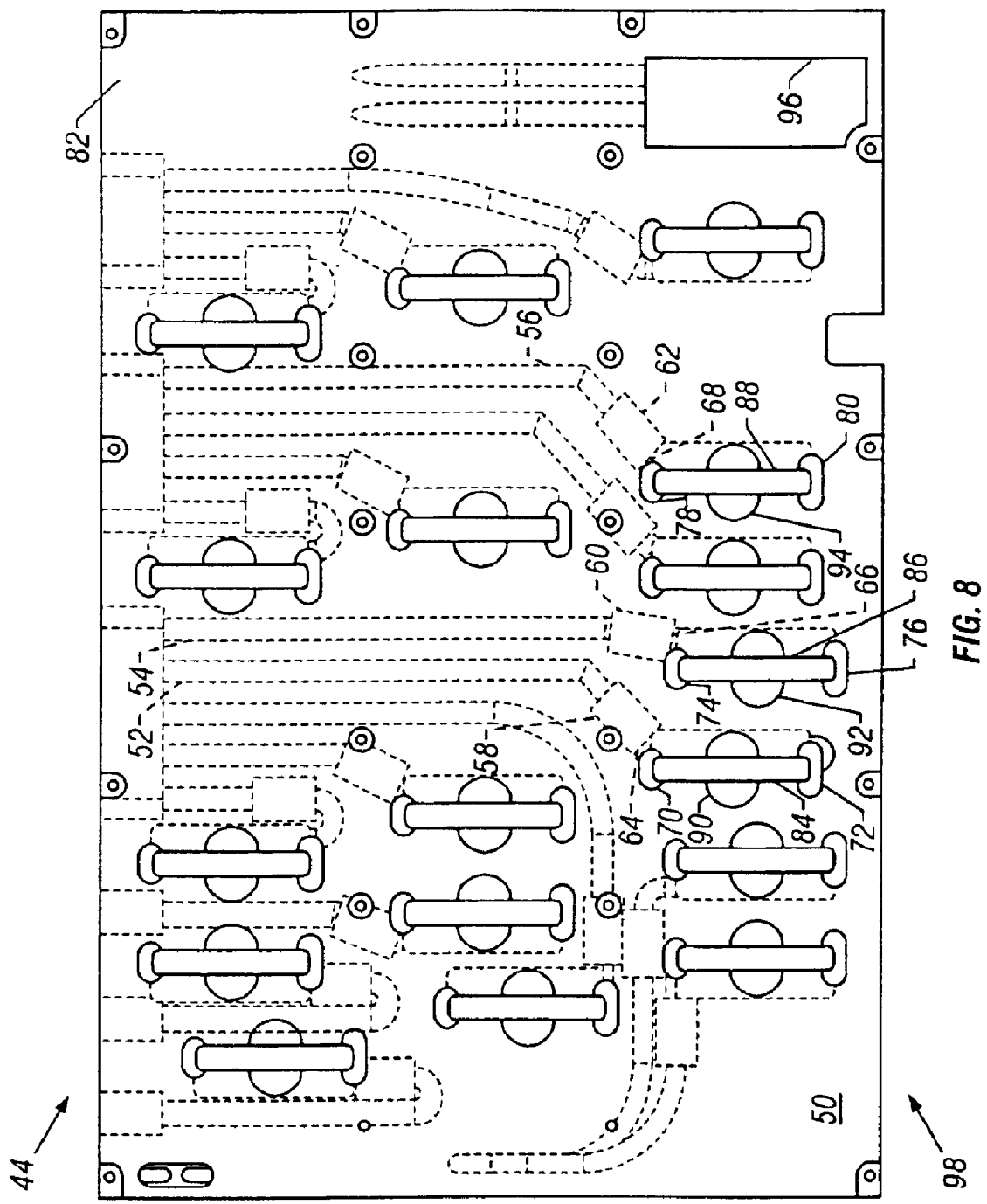
FIG. 8 is a front plan view of an exemplary electrical shield of the present invention.

FIG. 8 depicts a plan view of a presently preferred exemplary electrical shield 44 of the present invention, where the outer surface 50 of the electrical shield 44 is exemplified with a plurality of connector holes. Exemplary channels 52, 54 and 56 and exemplary contours 58, 60 and 62 are shown in dashed lines to signify that they are disposed on the other side (i.e., the inner surface) of the electrical shield 44. Channels 52, 54 and 56 are operable to receive electrical cabling (not shown). Contours 58, 60 and 62 intersect channels 52, 54 and 56 respectively, and are operable to receive ferrite cores (not shown), if necessary, coupled to electrical cabling. Ferrite cores are located near the terminus of an electrical cable. For example, contours 58, 60 and 62 which house ferrite cores coupled to electrical cabling are located near termini 64, 66 and 68, respectively.

Connector holes, such as connector holes 70, 72, 74, 76, 78 and 80 intersect channels and the outer surface 50 of the electrical shield 44. For example, connector holes 70, 74 and 78 intersect channels 52, 54 and 56 respectively. Slots, such as slots 84, 86 and 88 intersect the connector holes associated therewith. Slots and connector holes are operable to accommodate electrical cables. For example, slot 84 intersects connector holes 70 and 72 to accommodate an electrical cable. A technician can access the electrical cables coupled to the backplane, accommodated by the slots and connector holes, without having to remove the electrical shield from the backplane. Preferably, slots 84, 86 and 88 include ergonomically contoured holds 90, 92 and 94, respectively, which aid a technician in manipulation of the electrical cables and/or connectors by fingers. An opening 96 may be provided in the electrical shield 10 for accessing additional electronic components (not shown).

Figure 9:
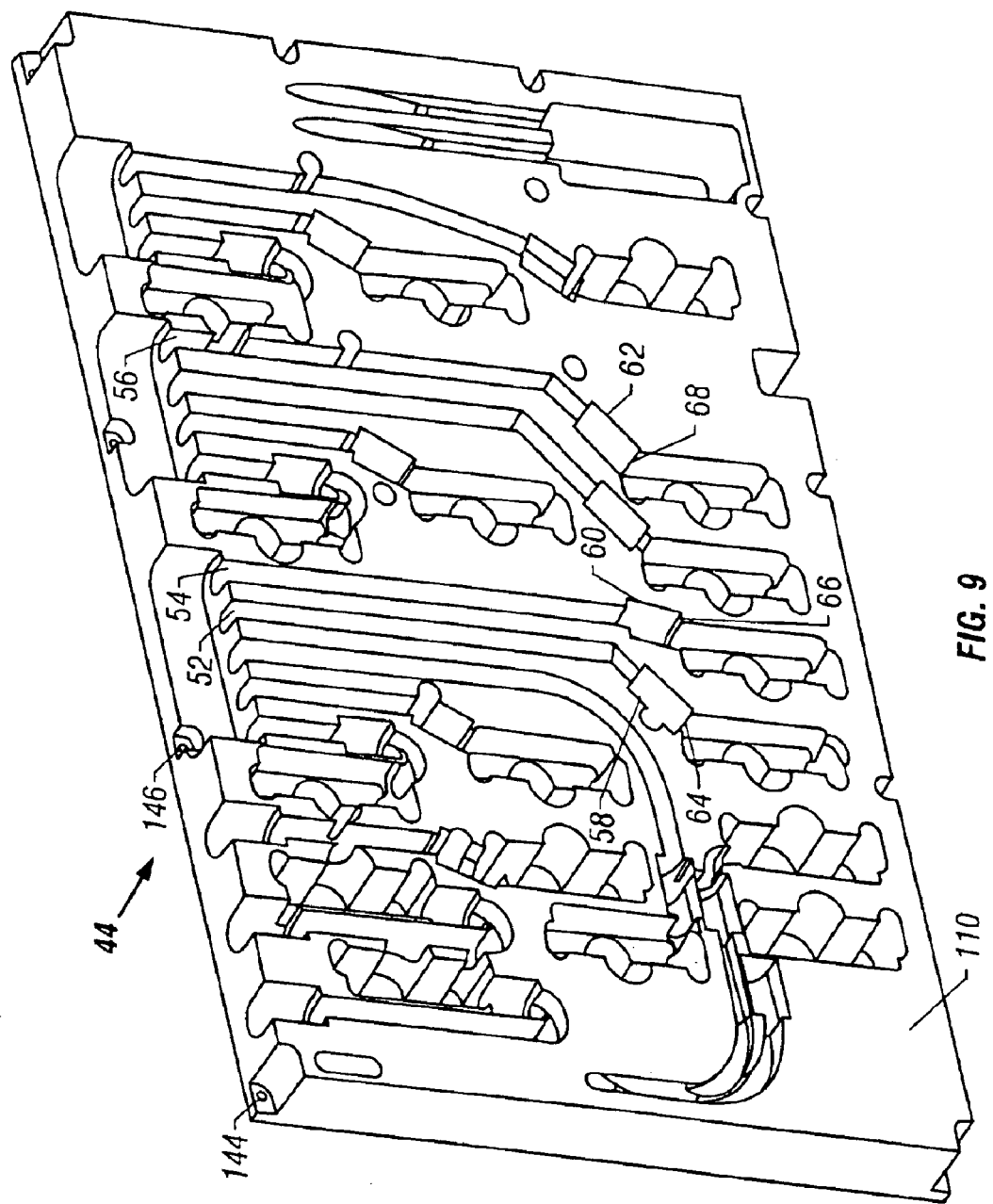
FIG. 9 is a perspective view of an exemplary electrical shield of the present invention.

FIG. 9 is a perspective view of the exemplary electrical shield 44, wherein the inner surface 110 having a predetermined pattern of channels is exemplified. Channels, such as channels 52, 54 and 56 receive electrical cabling (not shown). Contours, such as contours 58, 60 and 62 intersect channels 52, 54 and 56, respectively, and can house ferrite cores (not shown) coupled to electrical cabling. It should be readily seen that various connector holes, slots and ergonomically contoured holds are also shown in this FIG.

Exemplary apertures 144 and 146 are provided to allow the electrical shield 44 to be fastened to the backplane of a telecommunications equipment rack.

The electrical shield 44 is formed by first grooming the cables into a pattern on a backplane. Then, a structural plastic foam body is molded having channels that correspond to the groomed pattern of the cables so as to accommodate the electrical cables. Similarly, contours are molded to accommodate ferrite cores. Connector holes, slots and ergonomically contoured holes to accommodate cabling are also formed in the foam body to conform to telecommunications equipment design requirements. Accordingly, it should be apparent to one skilled in the art that the channels, contours, connector holes, slots, ergonomic contours and openings substantially conform to the pattern of electrical cabling and electronic components on the backplane.

The molding can be manufactured by any conventional polymer fabrication method. For example, the fabrication method may involve compression molding using heat and pressure to force the molten polymer or resin, introduced between the mating surfaces of a movable mold, into the shape of the mold. In another embodiment, the fabrication method can be comprised of injection molding where a molten polymer is compressed into a closed mold cavity. Other fabrication methods include reaction injection molding and extrusion filament spinning. After the molded body is fabricated, as discussed, an electrically conductive material is disposed on the outside surface, and, alternatively, additionally the inside surface and channels.

The electrical shield deigns of FIG. 8 and FIG. 9 are for illustrative purposes only. Even though a particular arrangement of channels, contours, connector holes, slots, ergonomic contours and openings are shown to accommodate a predetermined arrangement of electrical cables and electrical components, it should be understood by one skilled in the art that the electrical shield of the present invention can be designed to accommodate any arrangement of electrical cables and electrical components on the backplane. Furthermore, in some exemplary implementations a conductive plate may also be disposed on the outer surface of an electrical shield to enhance the grounding capability thereof. Where implemented, the conductive plate may preferably be coupled to the electrical shield of the present invention by such means as metallic compressible gaskets.

It should be appreciated by those skilled in the art that the electrical shield of the present invention advantageously overcomes the various limitations of the existing EMI and ESD solutions. By employing a body of moldable structural foam material with a conductive metallic coating, the number of ferrite cores is minimized, if not eliminated altogether, while EMI is attenuated in accordance with the applicable requirements. Further, a secure grounding path is also advantageously provided for ESD protection. Thus, the electrical shield of the present invention provides electromagnetic compatibility at a minimal tooling cost.

Although the invention has been described with reference to certain exemplary embodiments, it is to be understood that the forms of the invention shown and described are to be treated as presently preferred exemplary embodiments only. Various changes, substitutions and modifications can be realized without departing from the spirit and scope of the invention as defined by the appended claims.

What is claimed is:

1. An electrical shield for an electronic equipment rack mountable to a chassis of the electronic equipment rack, the electrical shield comprising:

a unitary body of moldable material, said body having a primary side and a secondary side, wherein a plurality of longitudinal contoured channels are formed on and planar to said primary side for receiving electrical cables therein; and an electrically conductive coating disposed at least on said secondary side, wherein said coating is operable in an electrically conductive relationship with the chassis in which said body of moldable material is operable to be disposed;

wherein said secondary side further comprises a plurality of openings associated with said plurality of longitudinal channels for enabling termination of the electrical cables with termination devices associated with a backplane.

2. The electrical shield of claim 1, wherein said secondary side comprises a substantially planar surface parallel to said contoured channels.

3. The electrical shield of claim 2, wherein said body of moldable material comprises a structural plastic foam.

4. The electrical shield of claim 2, wherein said coating comprises a metallic coating layer.

5. The electrical shield of claim 4, wherein said metallic coating comprises a copper layer.

6. The electrical shield of claim 1, wherein said secondary side comprises a substantially planar shield plane operably mountable in a parallel relationship with the backplane.

7. An electrical shield system for attenuating electromagnetic interference from electrical cables associated with telecommunications equipment backplane, comprising:

a body of moldable material, for coupling to the backplane;

said body having longitudinal channels formed on one side thereof which are to accommodate the electrical cables; and a conductive coating disposed on another side of said body, said another side having a substantially planar surface which is oriented in a substantially parallel relationship with said one side, said conductive coating and said another side in combination to provide a shield plane in a parallel relationship with the backplane in which said body is to be coupled thereto; and said channels are to accommodate a length of the electrical cables in a plane substantially parallel to said another side;

wherein said another side further comprises a plurality of openings associated with said longitudinal channels for enabling termination of the electrical cables with termination devices associated with the backplane.

8. The electrical shield system of claim 7, wherein said body is a unitary body of moldable material.

* * * * *